United States Patent [19]

Albert

[11] Patent Number: 5,440,250
[45] Date of Patent: Aug. 8, 1995

[54] CLOCK-GENERATING CIRCUIT FOR CLOCK-CONTROLLED LOGIC CIRCUITS

[75] Inventor: Michael Albert, Freiburg i. Br., Germany

[73] Assignee: Deutsche ITT Industries GmbH, Freiburg, Germany

[21] Appl. No.: 249,861

[22] Filed: May 26, 1994

[30] Foreign Application Priority Data

Jun. 26, 1993 [DE] Germany ............... 43 21 315.4

[51] Int. Cl.$^6$ ......................... H03K 19/096
[52] U.S. Cl. ......................... 326/97; 326/98; 327/296; 327/239; 327/142
[58] Field of Search ........... 326/93, 97, 98, 34; 327/256, 258, 171, 379, 381, 295, 296, 257, 239, 142

[56] References Cited

U.S. PATENT DOCUMENTS

| | | | |
|---|---|---|---|
| 3,745,380 | 7/1973 | Kitajima et al. | 307/247 |
| 4,379,974 | 4/1983 | Plachno | 307/269 |
| 4,417,158 | 11/1983 | Ito et al. | 307/269 |
| 4,554,465 | 11/1985 | Koike | 307/269 |
| 4,641,044 | 3/1987 | Shiraishi | 307/269 |
| 4,654,599 | 4/1987 | Zbinden et al. | 328/62 |
| 4,815,041 | 3/1989 | Baylock | 365/233 |
| 4,843,254 | 6/1989 | Motegi et al. | 307/272.2 |
| 4,929,854 | 5/1990 | Iino et al. | 307/480 |
| 5,047,659 | 9/1991 | Ulrich | 307/269 |
| 5,140,174 | 8/1992 | Meier et al. | 307/269 |
| 5,220,217 | 6/1993 | Scarrá et al. | 307/481 |
| 5,280,203 | 1/1994 | Hung et al. | 307/465 |
| 5,315,181 | 5/1994 | Schowe | 307/480 |

OTHER PUBLICATIONS

Jacobus Pretorious, Alex Shubat & Andre Salama; "Analysis and Design Optimization of Domino CMOS Logic with Application to Standard Cells"; IEEE Journal of Solid-State Circuits, vol. SC-20, No. 2; Apr. 1985; pp. 523-530.

Vojin Oklobdzua & Robert Montoye; "Design-Performance Trade-Offs in CMOS-Domino Logic"; IEEE Journal of Solid State Circuits, vol. SC-21, No. 2; Apr. 1985; pp. 304-306.

Elecktronikpraxis, No. 1, Jan. 1993, p. 91.

Introduction to VLSI Systems, Addison-Wesley Publishing Company, 1980, pp. 229 to 233.

*Primary Examiner*—David R. Hudspeth
*Assistant Examiner*—Stephen Calogero
*Attorney, Agent, or Firm*—Arthur L. Plevy

[57] ABSTRACT

A clock-generating circuit for logic circuits with clock-controlled decoupling stages includes an interlock circuit which, in an interlocking mode, sets the outputs of the clock-generating circuit and thus, the clock lines, to an interlocking potential, thereby causing the decoupling stages to be placed into a shunt-current-free operating state.

20 Claims, 5 Drawing Sheets

CLOCK-GENERATING CIRCUIT FOR CLOCK-CONTROLLED LOGIC CIRCUITS

FIELD OF THE INVENTION

The present invention relates in general to clock-generating circuits and more particularly to a clock-generating circuit for logic circuits that have clock-controlled decoupling stages.

BACKGROUND OF THE INVENTION

Logic circuits with clock-controlled decoupling stages that are connected by clock-signal lines to a clock generating circuit are referred to as dynamic or synchronized logic circuits. In such circuits, the processing speed depends not on the signal propagation delay through the individual logic stages, but on the period of a clock signal. Within a single clock unit, several logic stages may cooperate as one functional circuit unit, where the processing within this circuit unit is asynchronous in accordance with the technology-dependent propagation delay of the individual logic stages. The clock-synchronized input and output of data in the individual logic stages or circuit units is controlled by decoupling stages, with the design of the clock system and the decoupling stages ensuring that no data collision with other stages occurs at the input or output. The clock system switches the decoupling stages into an "on" state and an "off" state and ensures that the decoupling stages associated with logic stages or circuit units to be separated, particularly with logic stages or circuit units connected in series, are never simultaneously on.

A known clock system which achieves the desired synchronization in connection with clock-controlled decoupling stages is the nonoverlapping two-phase clock. The nonoverlapping clocks can be derived, for example, from a higher-frequency clock signal by applying logic operations. They may also be formed from an equal-frequency clock signal by evaluating the unavoidable propagation delays of logic stages. In a fundamental publication by Carver Mead and Lynn Conway, "Introduction to VLSI Systems", Addison-Wesley Publishing Company, 1980, pages 229 to 233, particularly FIG. 7, 6(a) on page 229, an exemplary circuit is described for generating the nonoverlapping two-phase clock by the second method. The nonoverlapping portion can be further enlarged, and thus made less sensitive to circuit or clock tolerances, by adding inverters in the respective clock lines. Such a two-phase clock generator is shown in FIG. 1 of U.S. Pat. No. 5,047,659 entitled "Non-Overlapping Two-Phase Clock Generator Utilizing Floating Inverters", issued on Sep. 10, 1991 to M. Ulrich and assigned to the assignee herein.

"Elektronikpraxis", No. 1, January 1983, page 91 describes a clock-generating circuit with an interlock circuit which switches the clock-signal line into a defined level state by means of an interlocking signal. The interlock circuit serves to ensure that upon turn-off and restart, only complete pulses are delivered as clock signals, so that the mark/space ratio remains accurately defined.

Especially suitable clock-controlled decoupling stages are logic stages with additional switch devices for the clock signals. The simplest example is a clocked inverter consisting of four series-connected p- and n-channel transistors. Another decoupling stage is a transfer gate formed from a parallel-connected n- and p-channel transistor pair which is connected into the signal line as an electronic series switch. Other clock-controlled decoupling stages are familiar to those skilled in the an, as are clock systems with more than two clock phases.

Clock-controlled decoupling stages generally suffer from the drawback that if the clock signal fails to appear, the outputs of the decoupling stages slowly change to a floating voltage state which, depending on the leakage currents present, lies more or less in the middle between the positive and negative supply potentials. The logic stages or circuit units connected to the output of the decoupling stage then see a drive potential which is not defined in the normal operating state with a 1 or 0 level, and which is traversed only briefly during a signal change. This may result in undefined operating states and cause disturbances which occur during the then clock-free operating state or only later when the clocks are turned on again. It is particularly disturbing if the logic stages or circuit units connected to the output of the decoupling stage are placed by this floating drive potential in a condition in which a steady-state shunt current flows between the positive and negative supply sources. This shunt current either does not occur in the normal sequence of operations, or it occurs only very briefly during the switching edges when the drive signal changes from one logic state to the other. Thus, a steady-state shunt current precipitated by the clock-signal failing to appear, may then become so large that the associated, possibly internal, voltage supply will be overloaded.

By turning off the clocks, at least in portions of an integrated circuit, a current reduction is to be effected through a standby mode in which the major part of the circuit remains in a current-saving, i.e., clock-free, state. Turning off the clocks is also advantageous upon turn-on of the supply voltage when the clock does not set in until the supply voltage is sufficiently high. If an uncontrolled shunt current flows during this starting phase, the start will be delayed and the supply-voltage source may, in the worst case, stick at a low voltage value due to overloading. In addition, upon turn-on, an internal configuration, known as "power-on reset", is generally initiated which should be completed prior to the onset of the clocks.

It is therefore the object of the present invention to provide a circuit for clock-controlled logic circuits which prevents the shunt-current paths in the logic circuit in the clock-free condition.

SUMMARY OF THE INVENTION

This invention is a clock-generating circuit for logic circuits coupled to the clock-generation circuit via clock-signal lines, where the logic circuits include decoupling stages. The clock-generating circuit includes an interlock circuit which, in conjunction with the rest of the clock-generating circuit and in an interlocking mode, forces the clock-signal lines into a state in which the outputs of the decoupling stages are connected through to an interlocking potential which corresponds to a first or second logic potential. This through-connection causes the inputs of logic stages or circuit units that are connected to the output of the decoupling stage to be driven with a defined 0 or 1 potential. Thus, no undefined operating state can result, and the shunt-current path in the individual circuits is reliably prevented. Another advantage of the forced control of the decoupling stages is that all decoupling stages are in a conducting state, so that a direct configuration of the whole circuit is possible. This permits a very fast reset function, because the logic states can propagate through the conducting decoupling stages without clock delay. Depending on the input signal, all logic states of the individual stages are defined. However, there must not be any data collisions at individual circuit nodes. Finally, the forced clock interlocking allows dynamic logic circuits to be treated like static logic circuits in the clock-free state for testing purposes, e.g., to measure the quiescent power consumption.

BRIEF DESCRIPTION OF THE DRAWINGS

For a better understanding of the present invention, reference is made to the following description of an exemplary embodiment thereof, considered in conjunction with the accompanying drawings, in which.

DETAILED DESCRIPTION OF THE INVENTION

Figure 1:
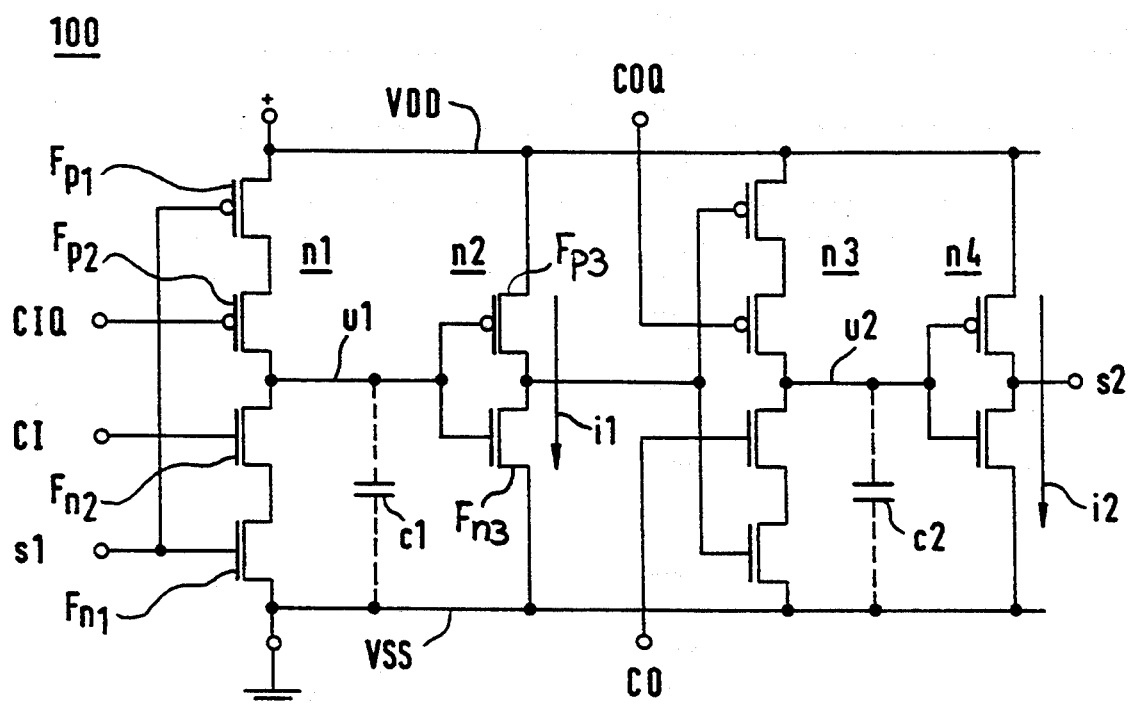
FIG. 1 shows schematically a portion of a clocked CMOS circuit of the prior art.

In order to clearly set forth the foundation of the present invention, reference is first had to a simple, clocked logic circuit of the prior art as shown in FIG. 1. A clocked logic circuit 100 includes a first clocked inverter n1 which is coupled in series with a first nonclocked inverter n2, a second clocked inverter n3, and a second nonclocked inverter n4. The individual stages are of conventional design. The first clocked inverter n1 includes a series combination of two p-channel transistors Fp1, Fp2 and two n-channel transistors Fn1, Fn2. The gate terminals of the two outer, complementary transistors, Fp1 and Fn1, are connected together and form the input for the input signal s1. The gate terminals of the inner p- and n-channel transistors Fp2 and Fn2 are supplied with the antiphase first clock-signal pair CI, CIQ. The associated, nonoverlapping second clock-signal pair is formed by the two clock signals CO, COQ, which are applied to the two clock inputs of the second clocked inverter n3. Inverter n3 is preferably identical to the first clocked inverter n1. The output of the first clocked inverter n1 is formed by the node of the two inner transistors Fp2 and Fn2. When the two clocked transistors Fp2 and Fn2 are on, i.e., conducting, the output voltage u1 is at a high or low potential, depending on the logic state of the input signal s1. The high potential, the logic 1 state, generally corresponds to the positive supply voltage VDD, and the low potential, the logic 0 state, to the lower supply potential VSS, usually ground potential. For simplicity, the clock signals will hereinafter also be referred to as CI-, CIQ-, CO-, and COQ-clocks. Also, instead of the respective clock-signal pairs, only the associated noninverted clock will occasionally be referred to.

Connected to the output of the first clocked inverter n1 is the input of a nonclocked logic stage which is formed here by the first nonclocked inverter n2. In the simplest case, this inverter is formed by the series combination of a p-channel transistor Fp3 and an n-channel transistor Fn3 coupled in series between the positive and negative supply voltages VDD, VSS. The input capacitance of the inverter n2 is illustrated as an equivalent capacitance c1.

Coupled to the output of the first nonclocked inverter n2 is the signal input of the second clocked inverter n3, whose output voltage u2 is applied to the input of the second nonclocked inverter n4, which provides the signal s2 at its output terminal. The capacitance load on the output terminal of the second clocked inverter n3 is illustrated by an equivalent capacitance c2 connected to this output. As the first clocked inverter n1 is clocked with the first clock CI, CIQ, and the second clocked inverter n3 with the second clock CO, COQ, the first clocked inverter n1 can only conduct when the second clocked inverter n3 is off. Similarly, the second clocked inverter n3 can only conduct when the first clocked inverter n1 is off. For the short nonoverlapping portion of the two-phase clock system, both clocked inverters n1, n3 are off.

In FIG. 1, the two clocked inverters n1, n3 perform a combined logic and decoupling function, and thus serve as decoupling stages. As a result of the interplay of the decoupling stages in conjunction with the nonoverlapping two-phase clock, the input signal s1 can reach, and change the logic state of, the first nonclocked inverter n2 only when the latter is decoupled from the second nonclocked inverter n4. Otherwise the information of the second nonclocked inverter n4 would be lost because the input signal s1, regardless of the logic states of the first nonclocked inverter n2 and the second clocked inverter n3, could be applied directly to the second non-clocked inverter n4.

In the "off" state of the clocked inverters n1 and n3, the output potentials u1 and u2, which are set during the conducting clock phase, are held and, thus, stored by the equivalent capacitances c1 and c2, respectively. Because of unavoidable leakage currents, however, the respective potentials u1 and u2 vary, so that the "off" state must not last too long if the output voltages u1 and u2 are to vary only insignificantly. If the output voltages u1 and u2 move into a middle range between the supply voltages VDD and VSS, the threshold voltage of the p- and n-channel transistors of the nonclocked inverters n2 and n4, respectively, will be exceeded. This will cause a first shunt current i1 and a second shunt current i2 to flow in the first nonclocked inverter n2 and the second nonclocked inverter n4, respectively. It is these shunt currents i1 and i2 that are to be reliably prevented by the clock-generating circuit according to the present invention. A similar problem arises in dynamic memory circuits, but in these circuits the problem can be eliminated by means of feedback circuits which hold the potential at the input of the memory stages.

Figure 4:
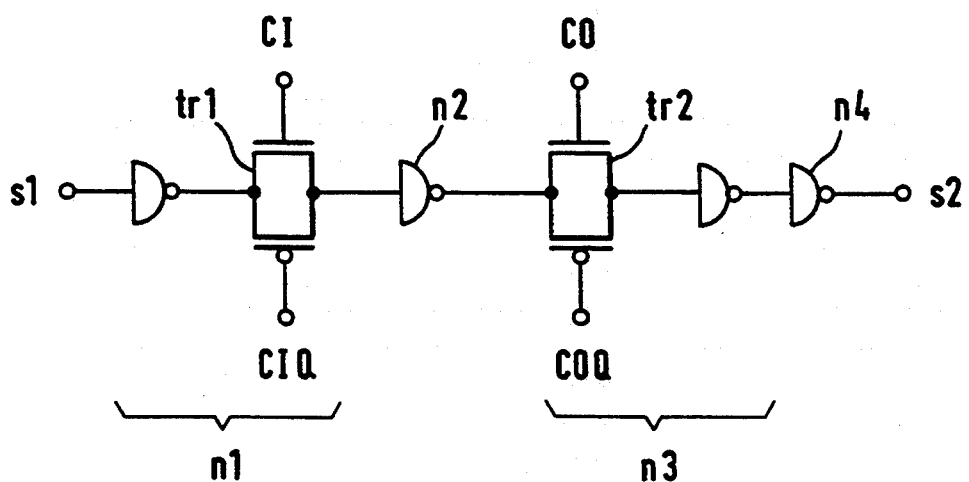
FIG. 4 shows a circuit equivalent to that of FIG. 1, using transfer gates for the decoupling stages.

A circuit which is very similar to that of FIG. 1 is shown in FIG. 4. It corresponds to the series combination of the four inverters n1 to n4 of FIG. 1, with each of the clocked inverters n1 and n3 replaced by the series combination of a nonclocked inverter and a transfer gate tr1 and tr2, respectively. The transfer gate thus performs the decoupling function of the clocked inverter.

Figure 2:
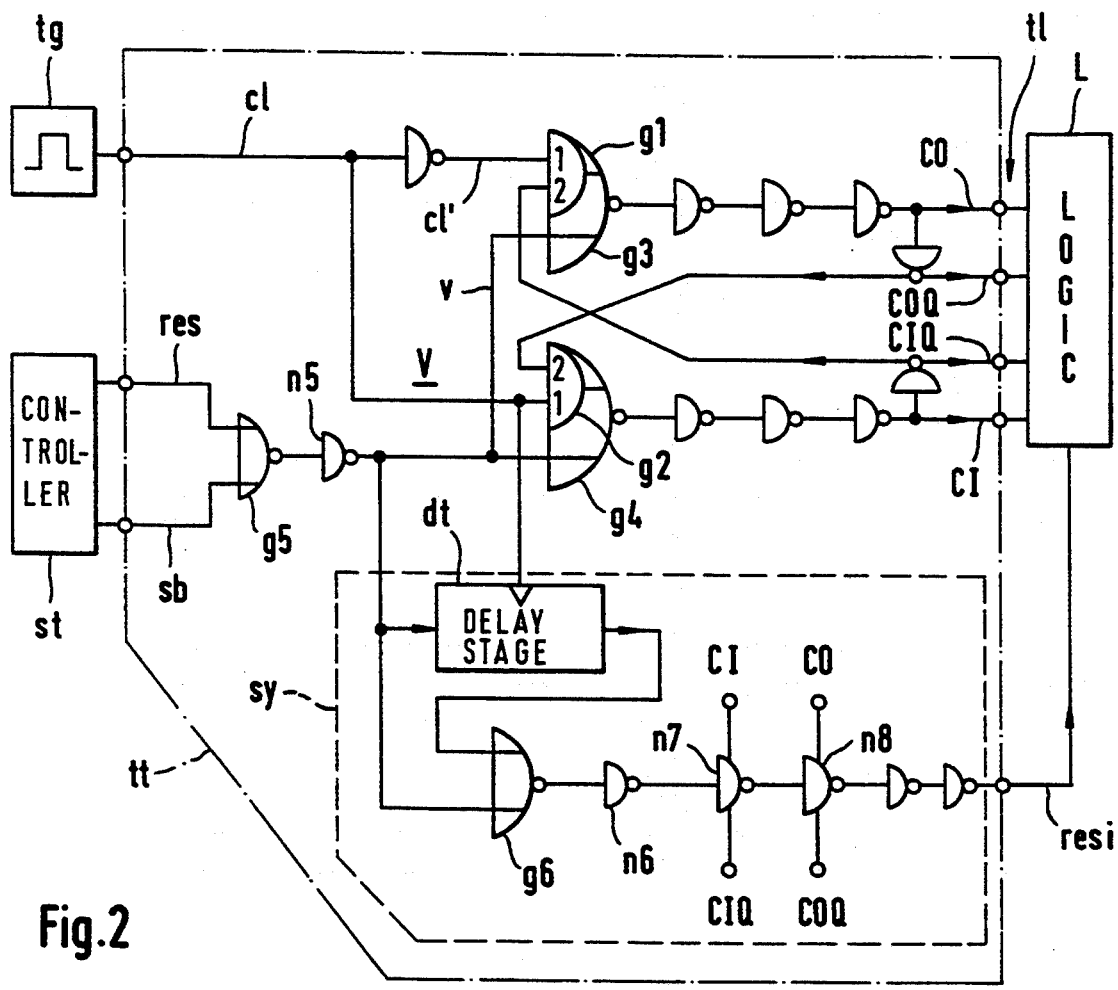
FIG. 2 is a circuit diagram of a preferred embodiment of the invention in the form of a two-phase clock generator with an interlock circuit.

Referring now to FIG. 2, there is shown a preferred embodiment of a clock generating circuit in accordance with the present invention. The invention teaches that the levels of the clock lines t1 are set by the clock-generating circuit tt in such a way that all decoupling stages n1, n3 or tr1, tr2 are switched into the conducting state. In the logic circuit L of FIG. 2 and in the decoupling stages shown in FIGS. 1 and 4, the CI- and CO-clock inputs have to be fed with a 1, and the CIQ- and COQ-clock inputs with a 0, for all decoupling stages to be conducting. In a clock system with more than two clocks, the interlocking potentials must also switch all decoupling stages into the conducting state. If a decoupling stage does not require antiphase clock signals, it suffices, of course, to apply the appropriate clock signal which causes the conducting state.

FIG. 2 illustrates by way of example, a clock generating circuit according to the invention embodied as a two phase clock generator tt which operates to force the four clock lines t1 for the clock-controlled logic circuit L into the interlocking state by means of a simple interlock circuit V. A clock generator tg generates a system clock c1 in the form of a square-wave signal with a 1:1 mark/space ratio. This system clock feeds the two-phase clock generator tt, which generates a nonoverlapping two-phase clock system consisting of four clock signals, namely two pairs of antiphase clock signals CI, CIQ and CO, COQ.

By means of an inverter, an inverted system clock c1' is formed from the system clock c1. It feeds the first input of a first AND gate g1, whose output is coupled to a cascade of three inverters. The output of this inverter cascade provides the CO-clock. A second AND gate g2 has the system clock c1 applied to its first input, and its output is coupled to a cascade of three inverters which provides the CI-clock at its output. An inverter changes the CO-clock into the COQ-clock, which is also fed back to a second input of the second AND gate g2. Similarly, an inverter changes the CI-clock into the CIQ-clock, which is also fed back to a second input of the first AND gate g1. The propagation delay through the four inverters and the blocking/unblocking of the clocks by means of the gates g1, g2 ensure that the nonoverlapping portion of the two clock-signal pairs CO, COQ and CI, CIQ is large enough (see also FIG. 3).

In the embodiment of FIG. 2, the interlock circuit V consists of a simple supplement of the two-phase clock generator tt. The control function for the interlocking state is performed by an interlocking signal v which controls the signal paths for the two clocks CI, CO via two gates. The output signal of the first AND gate g1 and the interlocking signal v are combined by a first NOR gate g3, whose output controls the inverter cascade for the CO-clock. Similarly, the output signal of the second AND gate g2 and the interlocking signal v are combined by a second NOR gate g4, whose output controls the inverter cascade for the CI-clock. The interlocking signal v, in conjunction with the two NOR gates g3, g4, causes the first and second clocks CI, CO to go to the interlocking state, here the 1 level, whenever the interlocking signal v occurs. This corresponds to the gating condition for the decoupling stages in FIG. 1, FIG. 2, and FIG. 4. The design of the gates as the interlock circuit V in FIG. 2 represents a particularly advantageous embodiment for implementation in CMOS technology. It is, of course, within the discretion of those skilled in the art to provide other circuits for the interlock circuit or to effect interlocking at another point of the respective clock-generating circuit used.

The interlocking signal v may be supplied from other subcircuits, in this example a controller st, or from an external source. In the embodiment of FIG. 2, the controller st produces a reset signal res upon turn-on of the supply network or standby signal sb if a standby mode is to be initiated. Each of these signals res, sb triggers the interlocking signal v by means of a third NOR gate g5 and a fifth inverter n5.

The leading and trailing edges of the reset signal res and of the standby signal sb are generally undefined in time and may change their direction several times. For the internal signal processing in the logic circuit L, however, a defined turn-off time is in many cases necessary, which should be referred in phase to the clock system used. This synchronization is accomplished in FIG. 2 by means of a synchronizing stage sy. The interlocking signal v is applied to a delay stage dt which provides at its output a 1 level of its input signal which is prolonged by a few clock-pulse periods. Short 0 levels are suppressed by this stage. The input and output of the delay stage dt are each connected to one input of a fourth NOR gate g6, whose output feeds a sixth inverter n6 having its output coupled to the input of a third clocked inverter n7. Already on its first occurrence, the interlocking signal v is thus presented to the input of the third clocked inverter n7, which is controlled by the CI-clock. The inverter n7 is followed by another, fourth, clocked inverter n8 which is controlled by the CO-clock. To provide signal amplification and decoupling, two further inverter stages follow, which provide an internal reset signal resi at their output. The turn-off edge of the internal reset signal resi is thus locked to the second clock CO, with the propagation delay through the two subsequent inverters having to be added. The delay stage dt causes the turn-off edge of the internal reset signal resi to be delayed for a few CI- and CO-clock pulse periods with respect to the triggering turn-off edge of the interlocking signal v, and to be synchronized with the CO-clock. The relevant signal waveforms are shown schematically in FIGS. 3 and 5.

Figure 3:
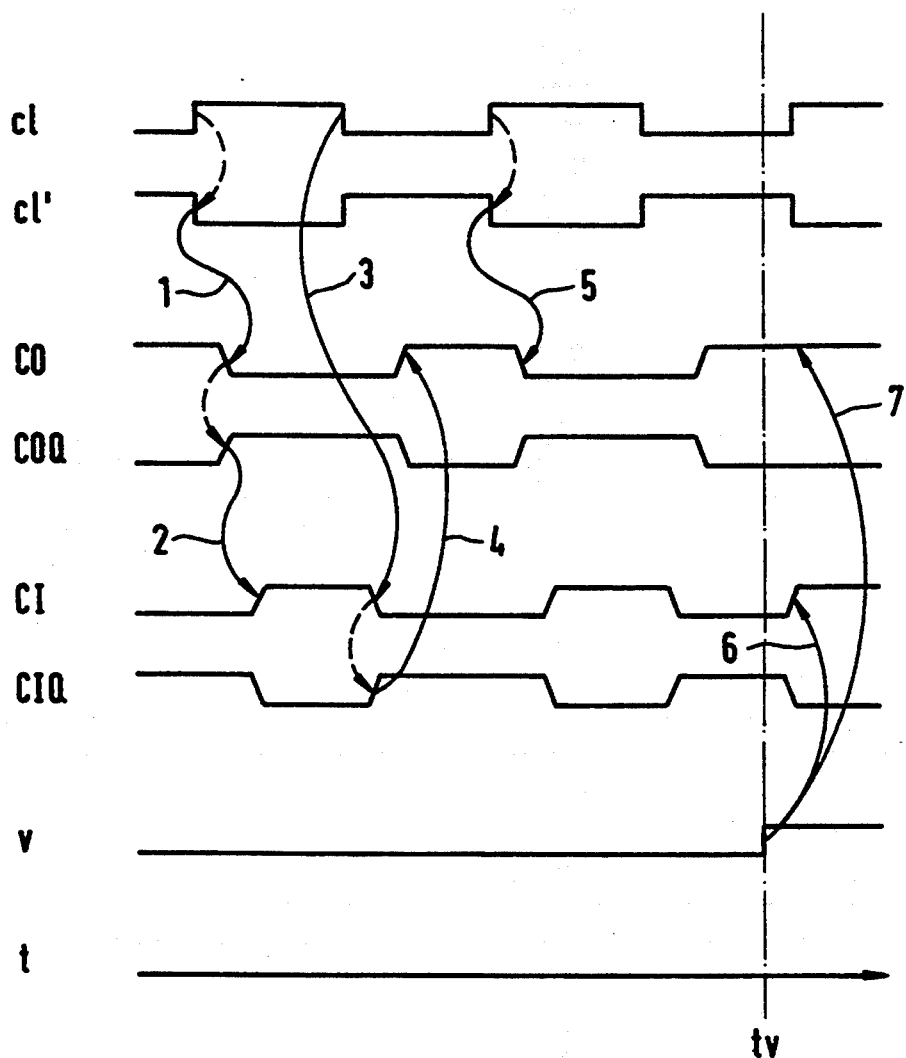
FIG. 3 is a timing diagram showing a few signal waveforms of the circuit arrangement of FIG. 2.

FIG. 3 shows the signal waveforms for the clock-signal generation in the two-phase clock generator tt of FIG. 2. The first two lines show the system clock c1 and the inverted system clock c1'. The next two lines show the second clock-signal pair CO-, COQ, and the next two lines the first clock-signal pair CI, CIQ. The penultimate line shows the onset of the interlocking signal v at the instant tv, and the last line represents the time axis t. In the diagram, the continuous arrows indicate the direction of action from the initiating event to the signal change. The dashed arrows also designate an initiating event and its action, but the signals, as a rule, travel only through a single logic stage, such as an inverter, so that the propagation delay is short.

The trailing edge of the inverted system clock c1' at the input 1 of the first AND gate g1, for example, triggers the trailing edge of the CO-clock, as indicated by arrow 1. Meanwhile, the CIQ-clock at the input 2 is at the 1 level. The leading edge of the COQ-clock, which is fed back to the second input of the second AND gate g2, triggers the trailing edge of the CI-clock, as indicated by arrow 2. Meanwhile, the COQ clock at the input 2 is at the 1 level. The trailing edge of the system clock c1 triggers the trailing edge of the CI-clock via the first input of the second AND gate g2, as indicated by arrow 3. The CIQ-clock, which is fed back to the second input of the first AND gate g1, triggers the leading edge of the CO clock, as indicated by arrow 4. The situation in the case of arrow 5 is exactly identical to the situation in the case of arrow 1—this completes the two-phase clock cycle. FIG. 3 illustrates how a nonoverlapping two-phase clock is derived from the square-wave system clock c1 by taking advantage of propagation delays and using suitable gate circuits.

The action of the interlocking signal v, which changes from the 0 state to the 1 state at the instant of interlocking tv, is indicated by arrows 6 and 7. At the instant tv, the first clock-signal pair CI, CIQ is in the false voltage state. By means of the second NOR gate g4, one input of which is supplied with the interlocking signal v, the voltage state is changed as indicated by arrow 6. The second clock-signal pair CO, COQ has the correct potential at the instant of interlocking tv, so that the voltage state is not changed by means of the first NOR gate g3, as indicated by arrow 7.

FIG. 4 is an equivalent to the circuit of FIG. 1, as described above. The two transfer gates tr1, tr2, each having a nonclocked inverter associated therewith, correspond to the two clock inverters n1, n3, of FIG. 1. When the first transfer gate tr1 is off, and if this condition lasts for a prolonged period of time, a shunt current can flow through the inverter n2 if no clock interlocking is provided for in accordance with the invention. The same applies to the transfer gate tr2 and the two following inverters.

Figure 5:
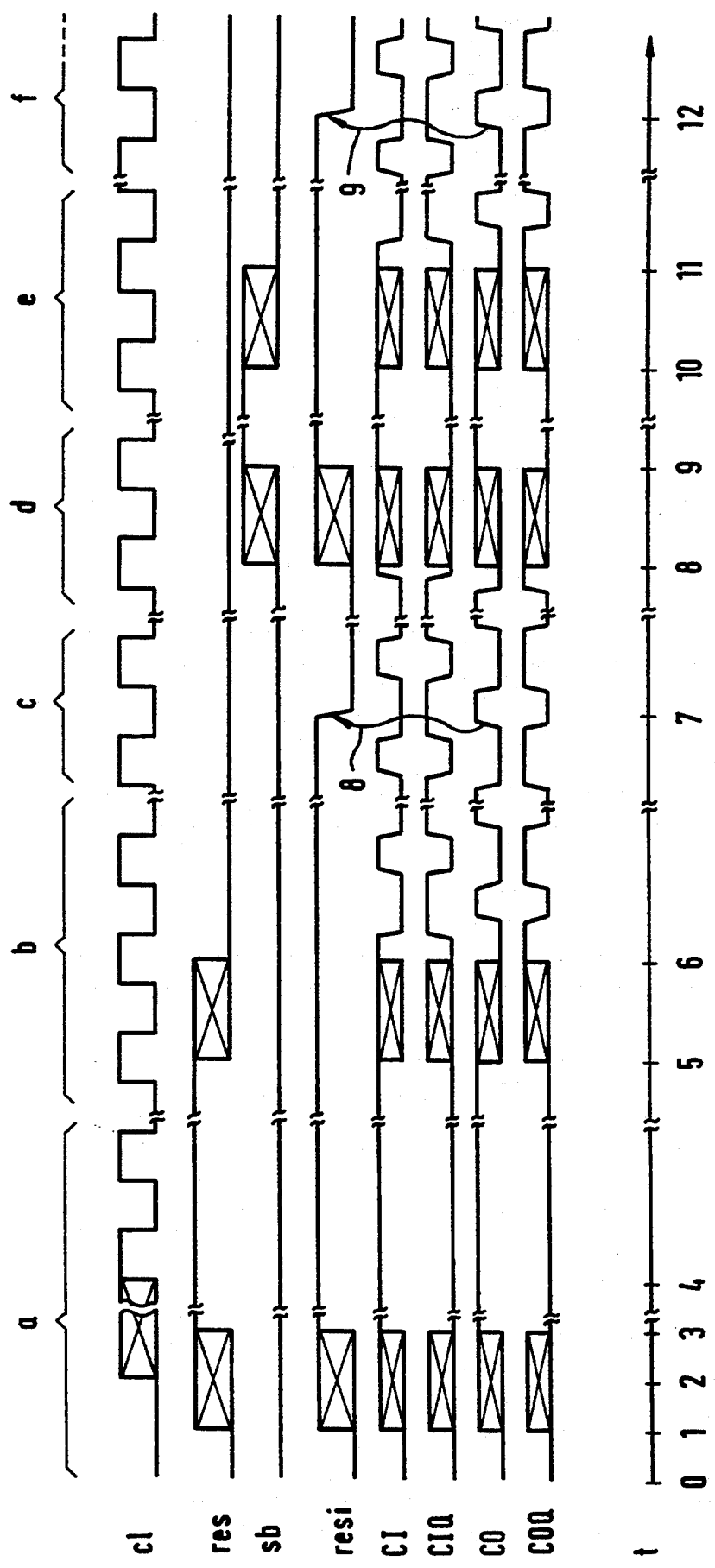
FIG. 5 is a timing diagram showing the waveforms of a nonoverlapping two-phase clock under the action of the interlock circuit in accordance with the invention.

FIG. 5 shows a few signal waveforms of the embodiment of FIG. 2 in a timing diagram. It illustrates the operation of the interlock circuit V and the synchronizing stage sy in connection with a two-phase-clock-generating system, so that the principle can be readily applied to other clock systems. In the signal waveforms, the areas marked with a prostrate cross represent undefined signal states in which changes of state are possible. Sections a to c illustrate the turn-on starting phase, i.e., "the power-on-reset mode", and sections d to f the standby mode.

In the time interval 0 to 1, the supply voltage is still so small that all signals are at zero level. In the time interval 1 to 4, parts of the circuit may already be in operation because the supply voltage has increased, so that some signals may assume an undefined state. The reset signal res should therefore be in the stable 1 state as early as possible. This is achieved at the instant 3, so that from this instant, the clocks CI, CIQ, CO, COQ are also in the interlocking state. This occurs regardless of whether the system clock cl is already present or not present. In the interval 1 to 3, the unstable reset signal forces the clocks into the interlocking state only occasionally. The stable system-clock mode cl is achieved at the instant 4. Compared with the time interval 1 to 3, the time interval 3 to 4 may be relatively long. Between the instants 3 and 5, the interlocking state is stable and all logic states or signals with the exception of the alternating system clock cl are "frozen".

In section b, the starting phase is terminated as the reset signal returns to its 0 state between the instants 5 and 6. This may occur in a rather undefined manner. The internal reset signal resi remains in its stable 1 state as a result of the internal delay. Since, in FIG. 2, the interlocking signal v is, in the starting case, locked to the reset signal res, the clocks CI, CIQ, CO, COQ are also undefined in the time interval 5 to 6. Only from the instant 6 does the two-phase clock generator tt provide the nonoverlapping two-phase clock again in the proper manner.

The defined turn-off edge of the internal reset signal resi occurs at the instant 7 and is triggered in the synchronizing stage sy by the leading edge of the CO-clock, see arrow 8. This completes the starting condition for all circuit areas.

Normal operation is interrupted at the instant 8 by a standby mode, which is initiated by the standby signal sb. Any instability of this signal that may be present is terminated at the instant 9, so that from this instant at the latest, the clock signals CI, CIQ, CO, COQ change to the stable interlocking state. The system clock cl is independent of this; for example, it may continue uninterrupted from the instant 4. The standby state is terminated in section e between the instants 10 and 11 as the standby signal goes back to the 0 state. The internal reset signal resi, which is dependent on the standby signal, remains in the stable 1 state because of the internal delay. The nonoverlapping two phase clock beings to run regularly again at the instant 11. The undefined leading edge of the internal reset signal resi in the time intervals 1 to 3 and 8 to 9 corresponds to the undefined state of the interlocking signal v, whose short-time 1 states activate the interlock circuit V temporarily. This directly opens the synchronizing stage sy for the interlocking signal v.

At the instant 12, the standby state is terminated for the entire circuit as the internal reset signal resi goes to the 0 state in a defined manner. This transition is initiated in the synchronizing stage sy by the leading edge of the CO-clock (see arrow 9). After the instant 12, all subcircuits are back in the normal, clocked operating state.

Figure 6:
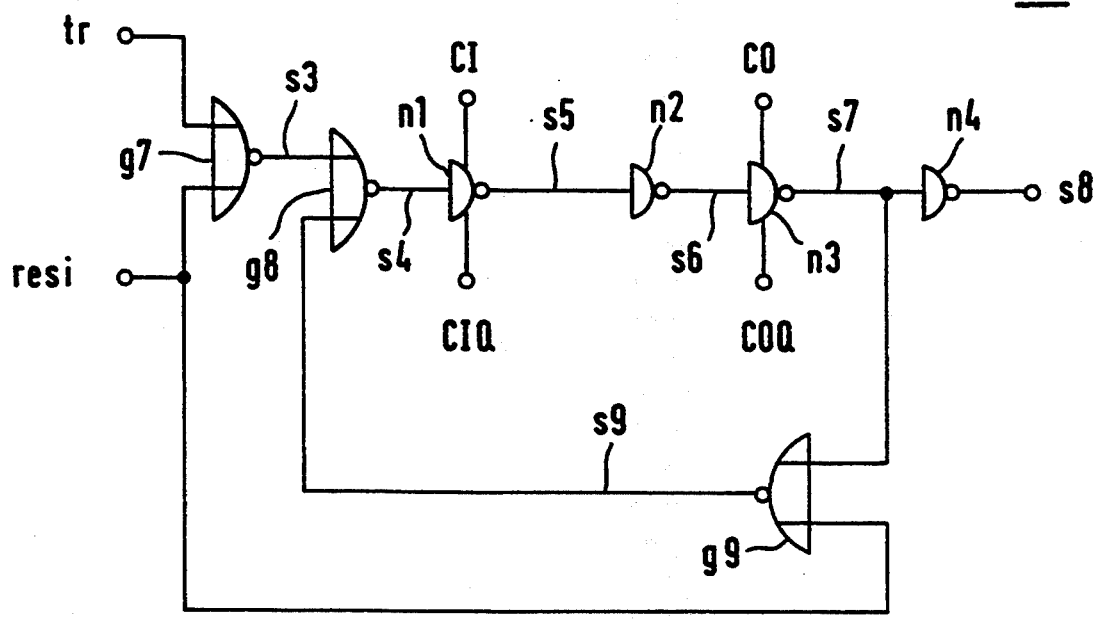
FIG. 6 shows the application of the invention to a clock pulse divider circuit.
Figure 7:
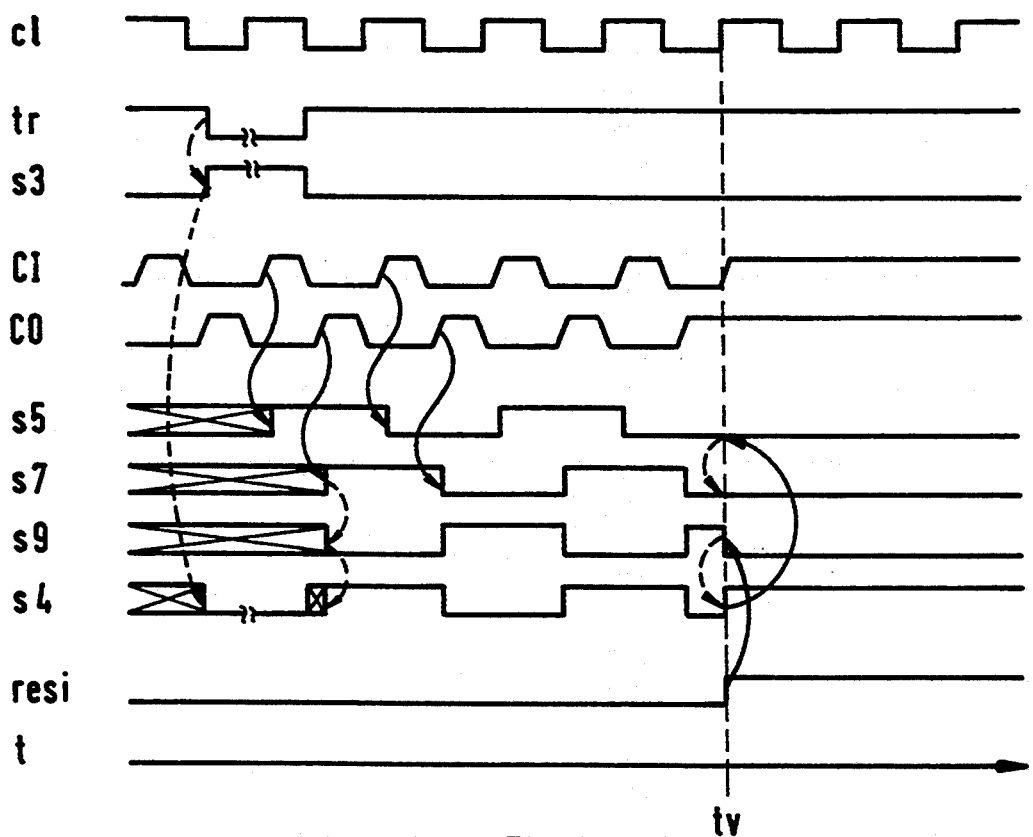
FIG. 7 is a timing diagram showing a few signal waveforms of the circuit of FIG. 6.

FIG. 6 shows an example of a circuit 600 in which the clock-interlocking scheme and the internal reset signal resi are used. Circuit 600 is a clock pulse divider which delivers as output signal s8 a clock of half the frequency of the two-phase clock CI, CO. The output signal s8 is obtained by inverting an intermediate signal s7, whose waveform is shown in FIG. 7. A negative pulse of a trigger signal tr triggers, via a fifth NOR gate g7, a positive pulse s3 which is applied through a sixth NOR gate g8 to a clocked inverter n1, which is turned on by the CI-clock (see also FIG. 7). The arrangement of the series-connected inverters n1, n2, n3, n4 is identical to the circuit of FIG. 1 and, hence, need not be explained again. The output s7 of the second clocked inverter n3 is applied to a seventh NOR gate g9, whose output s9 is fed back to a further input of the sixth NOR gate g8. A feedback loop is thus provided which generates the desired output clock s8 by means of the inverter n4. The divider function is interrupted by the internal reset signal resi, which pulls the signal s3 to the 0 level by means of the NOR gate g7, thus making the trigger signal tr ineffective. At the time, according to the invention, the interlocking state for the decoupling stages n1, n3 is established.

In the interlocking state, the first and second clocked inverters n1, n3 are conducting, so that instead of the intended standby mode, a highly active ring oscillator with a high-frequency output signal s8 would be formed via the feedback. This unwanted feedback path is blocked by the internal reset signal resi via the seventh NOR gate g9. A 1 level of the internal reset signal resi forces the feedback signal s9 to a 0 level, whereby the feedback is prevented.

The operation of the circuit of FIG. 6 is illustrated in FIG. 7 by a few signal waveforms. As in FIG. 5, the continuous and dashed arrows indicate the initiating event and the signal on which it acts, respectively. Of the two-phase clock system, only the CI- and CO-clocks are shown. At the instant of interlocking tv, the two-phase clock CI, CO changes to its interlocking state. For the sake of clarity, the undefined intermediate portion, (cf. in FIG. 5 the time intervals 1 to 3 or 8 to 9) is not shown. The blocking effect of the internal reset signal resi on the feedback path is illustrated by the signal waveform s9, which assumes a 0 level at the instant of interlocking tv.

Thus disclosed is a clock generating circuit for logic circuits that have clock-controlled decoupling stages. The clock generating circuit includes an interlock circuit for forcing clock signal lines into a state in which the outputs of the decoupling stages are connected through to an interlocking potential which corresponds to a logic 0 or 1 potential. Among the advantages of the clock generating circuit of the present invention is that shunt current paths within the decoupling stages of the logic circuit are prevented.

It should be understood that the embodiment described herein is merely exemplary and that a person skilled in the art may make many variations and modifications without departing from the spirit and scope of the invention. All such modifications are intended to be included within the scope of the invention as defined in the appended claims.

What is claimed is:

1. In a clock-generating circuit for delivering clock signals to a logic circuit coupled to said clock-generating circuit via clock-signal lines, said logic circuit including decoupling stages which undesirably conduct shunt currents in the absence of said clock signals, the improvement therewith comprising:
   an interlock circuit adapted to receive at least one input signal, wherein said interlock circuit is coupled to said clock-signal lines and responsive to said at least one input signal, for suspending said delivery of said clock signals and for forcing said clock-signal lines into a state causing said decoupling stages to be placed into a shunt-current-free operating state during the absence of said clock signals.

2. The clock-generating circuit according to claim 1, wherein said forcing of said clock-signal lines occurs during an interlocking mode controlled by an interlocking signal and wherein said shunt-current-free operating state of said decoupling stages remains stable for the duration of said interlocking mode.

3. The clock-generating circuit according to claim 2 further including a reset signal generated during a turn-on starting phase wherein said interlocking signal is locked to said reset signal.

4. The clock-generating circuit according to claim 2 further including a standby signal generated in a standby mode wherein said interlocking signal is locked to said standby signal.

5. The clock-generating circuit according to claim 2, wherein said interlock circuit includes, for each pair of clock signal lines, at least one gate circuit for combining an input clock signal and said interlocking signal.

6. The clock-generating circuit according to claim 2, wherein said interlocking circuit includes, for each clock signal line, at least one gate circuit for combining an input clock signal and said interlocking signal.

7. The clock-generating circuit according to claim 2 further including a synchronizing stage wherein said interlocking signal is provided to said synchronizing stage and said synchronizing stage generates an internal reset signal having a defined turn-off edge synchronized with one of at least one input clock signal, said internal reset signal being provided to said logic circuit.

8. The clock-generating circuit according to claim 7, wherein said synchronizing stage includes an interference-suppression circuit adapted to receive said interlocking signal for suppressing the effect of any unstable states of said interlocking signal on said logic circuit.

9. The clock-generating circuit according to claim 8 wherein said unstable states of said interlocking signal are suppressed by means of the synchronization of said turn-off edge of said internal reset signal.

10. The clock-generating circuit according to claim 8, wherein said synchronizing stage comprises:
   a clocked delay stage having an input terminal adapted to receive said interlocking signal;
   a NOR gate having a first input terminal coupled to an output terminal of said delay stage, and having a second input terminal adapted to receive said interlocking signal;
   a first inverter gate having an input terminal coupled to an output terminal of said NOR gate;
   a second clocked inverter gate having an input terminal coupled to an output terminal of said first inverter gate;
   a third clocked inverter gate having an input terminal coupled to an output terminal of said second clocked inverter;
   a chain of at least one other inverter gate coupled in series between an output terminal of said third clocked inverter and said logic circuit wherein said internal reset signal is generated and provided at an output of said chain of other inverters.

11. The clock-generating circuit according to claim 10 wherein said clock-generating circuit converts an input clock signal to output clock-signals for said delivering to said logic circuit;
   said clocked delay stage having a clock input terminal adapted to receive said input clock signal; and
   wherein said clocked delay stage prolongs logic level 1 signals present at said input terminal of said delay stage by several clock-pulse periods and provides a prolonged logic level 1 signal at said output terminal of said delay stage, and wherein said delay stage suppresses short logic level 0 input signals.

12. The clock-generating circuit according to claim 1, wherein said clock-generating circuit generates a nonoverlapping two-phase clock system, said system comprising two pairs of antiphase clock signals wherein said clock signals are provided to said clock-signal lines.

13. The clock-generating circuit according to claim 2 further comprising:
   a first inverter gate having an input terminal for receiving an input clock signal;
   a first AND gate having a first input terminal coupled to an output terminal of said first inverter gate;
   a second AND gate having a first input terminal coupled to receive said input clock signal;
   a first NOR gate having a first input terminal coupled to an output terminal of said first AND gate, and having a second input terminal coupled to receive said interlocking signal;

a second NOR gate having a first input terminal coupled to an output terminal of said second AND gate, and having a second input terminal coupled to receive said interlocking signal;

a first series chain of inverter gates coupled between a first output terminal of said first NOR gate and a first external output clock-signal line wherein a first clock signal is provided to said first output clock-signal line;

a second inverter gate having an input terminal coupled to receive said first output clock signal, and having an output terminal, on which a second output clock signal is provided to a second external clock-signal line wherein said output terminal of said second inverter is coupled to a second input terminal of said second AND gate;

a second series chain of inverter gates coupled in series between a first output terminal of said second NOR gate and a third external clock-signal line wherein a third output clock signal is provided to said third external clock-signal line;

a third inverter gate having an input terminal coupled to receive said third output clock signal, and having an output terminal, on which a fourth output clock signal is provided to a fourth external clock-signal line, and said output terminal of said third inverter gate is coupled to a second input terminal of said first AND gate;

whereby a non-overlapping two-phase clock system is generated, said system comprising two pairs of antiphase clock signals provided to said clock signal lines wherein said first and second output clock signals form a first pair of antiphase clock signals and said third and fourth output clock signals form a second pair of said two pairs or antiphase clock signals.

14. The clock-generating circuit according to claim 3 further comprising a NOR gate and an inverter, wherein said interlocking signal is locked to a standby signal generated in a standby mode, said standby signal being inputted to a first input terminal of said NOR gate, said reset signal being inputted to a second input terminal of said NOR gate, said inverter having an output terminal and having an input terminal coupled to an output terminal of said NOR gate, whereby said interlocking signal is provided at said output terminal of said inverter.

15. The clock-generating circuit according to claim 14, wherein said reset signal and said standby signal are generated by a controller.

16. The clock-generating circuit according to claim 1 wherein said decoupling stages comprise clocked inverters adapted to receive said delivered clock signals, each of said clocked inverters including p-channel and n-channel transistors.

17. The clock-generating circut according to claim 1 wherein each of said decoupling stages comprise a series combination of a nonclocked invertor and a transfer gate.

18. A clock-generating circuit for logic circuits coupled to said clock-generating circuit by clock-signal lines, for delivering clock signals to said logic circuits, said logic circuits including clock-controlled decoupling stages which undesirably conduct current in the absence of said clock signals, said clock-generating circuit comprising:

an interlock circuit adapted to receive at least one input signal, wherein said interlock circuit is coupled to said clock-signal lines and responsive to said at least one input signal for generating an interlocking signal during an interlocking mode;

wherein said interlocking circuit is responsive to said interlocking signal to suspend said delivery of said clock signals and to force said clock-signal lines into a first logic level state in which said logic circuits are supplied said first logic level present on said clock-signal lines;

wherein said first logic level present on said clock-signal lines causes said decoupling stages to be placed into a shunt-current-free operating state for the duration of said interlocking mode.

19. The clock-generating circuit according to claim 18 wherein said delivered clock signals are nonoverlapping two phase clock signals and wherein said clock-generating circuit converts a single input clock signal into said delivered clock signals.

20. The clock-generating circuit according to claim 18 wherein said interlocking signal is locked to a reset signal, wherein said reset signal is generating by a controller during a turn-on starting phase.

* * * * *